(12) United States Patent
Daubenspeck et al.

(10) Patent No.: US 7,335,577 B2
(45) Date of Patent: Feb. 26, 2008

(54) CRACK STOP FOR LOW K DIELECTRICS

(75) Inventors: Timothy H. Daubenspeck, Colchester, VT (US); Jeffrey P. Gambino, Westford, VT (US); Stephen E. Luce, Underhill, VT (US); Thomas L. McDevitt, Underhill, VT (US); William T. Motsiff, Essex Junction, VT (US); Mark J. Pouliot, Bristol, VT (US); Jennifer C. Robbins, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 11/317,042

(22) Filed: Dec. 22, 2005

(65) Prior Publication Data

US 2006/0099775 A1 May 11, 2006

Related U.S. Application Data

(62) Division of application No. 10/604,517, filed on Jul. 28, 2003, now abandoned.

(51) Int. Cl.
*H01L 21/46* (2006.01)

(52) U.S. Cl. .................... 438/462; 438/465

(58) Field of Classification Search ............. 438/460, 438/458, 462, 463, 464, 465, 68, 113, 114
See application file for complete search history.

(56) References Cited

U.S. PATENT DOCUMENTS

| | | | |
|---|---|---|---|
| 4,610,079 A | 9/1986 | Abe et al. | |
| 5,024,970 A | 6/1991 | Mori | |
| 5,414,297 A | 5/1995 | Morita et al. | |
| 5,665,655 A | 9/1997 | White | |
| 5,763,936 A | 6/1998 | Yamaha et al. | |
| 5,776,826 A | 7/1998 | Mitwalsky et al. | |
| 5,834,829 A | 11/1998 | Dinkel et al. | |
| 5,910,679 A | 6/1999 | Kim | |
| 5,994,762 A | 11/1999 | Suwanai et al. | |
| 6,022,791 A * | 2/2000 | Cook et al. | 438/458 |
| 6,028,347 A | 2/2000 | Sauber et al. | |
| 6,104,079 A | 8/2000 | Stamper | |
| 6,271,578 B1 | 8/2001 | Mitwalsky et al. | |
| 6,303,977 B1 | 10/2001 | Schroen et al. | |
| 6,335,559 B1 | 1/2002 | Charles | |
| 6,365,958 B1 | 4/2002 | Ibnabdeljalil et al. | |
| 6,383,893 B1 | 5/2002 | Begle et al. | |
| 6,509,622 B1 | 1/2003 | Ma et al. | |
| 2003/0100143 A1 | 5/2003 | Mulligan et al. | |

* cited by examiner

*Primary Examiner*—Kevin M. Picardat
(74) *Attorney, Agent, or Firm*—Scully, Scott, Murphy & Presser, P.C.; William D. Sabo, Esq.

(57) ABSTRACT

A crack stop for low K dielectric materials of an integrated circuit (IC) formed on an IC chip using metal interconnects which do not form a self-passivating oxide layer, such as copper or silver interconnects, in a low-K dielectric material to prevent damage to the active area of the IC chip caused by chipping and cracking formed along peripheral edges of the IC chip during a dicing operation. A moisture barrier or edge seal is formed as a metal stack positioned along the outer peripheral edges of the active area of the IC chip. The crack stop is formed by at least one trench or groove positioned outside of the moisture barrier/edge seal on the outer periphery of the IC chip.

9 Claims, 2 Drawing Sheets

Crack stop with metal removed

CRACK STOP FOR LOW K DIELECTRICS

RELATED APPLICATIONS

This application is a divisional of application Ser. No. 10/604,517, filed Jul. 28, 2003 now abandoned.

BACKGROUND OF THE INVENTION

1. Field of the Invention

The present invention relates generally to a crack stop for low K dielectric materials of an integrated circuit (IC) formed on an IC chip using metal interconnects which do not form a self-passivating oxide layer, such as copper or silver interconnects, in a low-K dielectric material such as silicon dioxide SiO2.

More particularly, the subject invention pertains to crack stop structures, and methods for forming the crack stop structures, for preventing damage to the active area of an IC chip, using metal interconnects such as copper or silver interconnects in a low-K dielectric material, caused by chipping and cracking formed along peripheral edges of the IC chip during a dicing operation performed on the IC chip. A moisture barrier or edge seal is formed as a metal stack positioned along the outer peripheral edges of the active area of the IC chip. The crack stop is formed by at least one trench or groove positioned outside of the moisture barrier/edge seal on the outer periphery of the IC chip.

2. Discussion of the Prior Art

During an IC chip dicing operation, cracks form that can propagate into the active area of the IC chip, causing fails. In the prior art, crack stop layers have been incorporated into the perimeter of the IC chip to prevent cracks formed during chip dicing from propagating into the chip. The cracks generally propagate through the BEOL (back end of line) dielectrics which are generally brittle materials such as silicon dioxide SiO2.

In prior art aluminum Al interconnect technology, wherein Al forms a self-passivating oxide layer, the crack stop has been formed as either a metal stack or an etched-out region that surrounds the active circuit area of the chip, and prevents cracks from traversing the BEOL dielectrics into the IC chip.

In prior art copper Cu interconnect technology, the crack stop has been formed as a metal stack that surrounds the active circuit area of the chip to prevent the propagation of cracks from traversing the BEOL dielectrics into the IC chip.

The prior art has also formed a triple edge seal. However the additional edge seal has the disadvantage of taking up more area on the IC chip.

SUMMARY OF THE INVENTION

The present invention provides crack stop structures, and methods for forming crack stop structures, for an integrated circuit (IC) formed on an IC chip using metal interconnects which do not form a self-passivating oxide layer, such as copper or silver interconnects, in a low-K dielectric material such as silicon dioxide SiO2. The crack stop prevents the propagation of cracks, caused by chipping and cracking formed along peripheral edges of the IC chip during a dicing operation, into active circuit areas of the IC chip. A moisture barrier or edge seal is formed as a metal stack positioned along the outer peripheral edges of the active area of the IC chip. The crack stop is formed by at least one trench or groove positioned outside of the moisture barrier/edge seal on the outer periphery of the IC chip.

In greater detail, the moisture barrier/edge seal comprises at least one inner boundary moisture barrier/edge seal formed by a metal stack around the active circuit area of the IC chip, wherein each metal stack can comprise a number of metal lines and via bars. Moreover, the crack stop can comprise a plurality of trenches or void regions formed outside of the moisture barrier/edge seal on the outer periphery of the IC chip.

BRIEF DESCRIPTION OF THE DRAWINGS

The foregoing objects and advantages of the present invention for a crack stop for low K dielectrics may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

Figure 1:
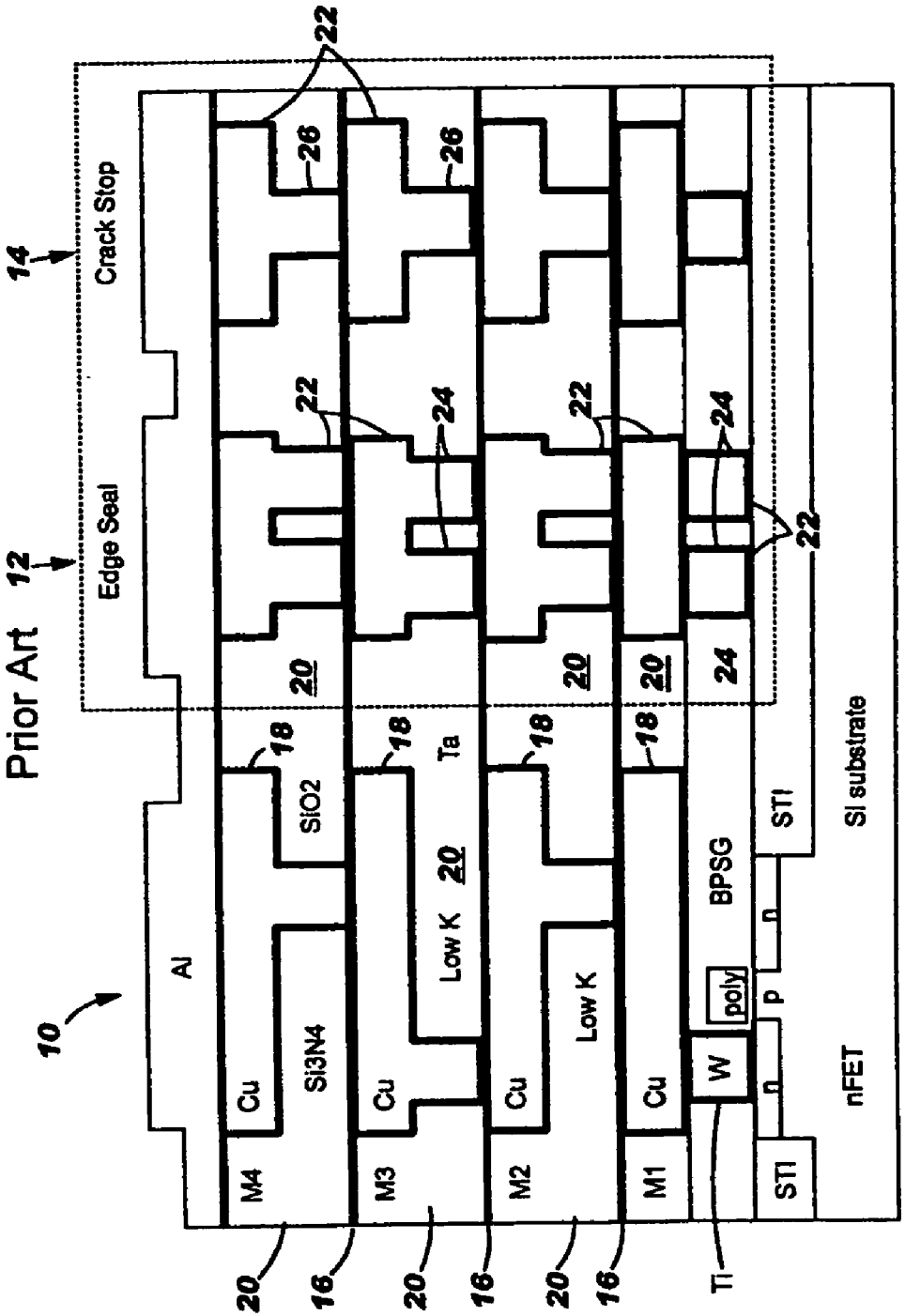
FIG. 1 illustrates a prior art metal stack crack stop which has been used in copper Cu interconnect technology on an IC chip to prevent the propagation of cracks formed during dicing into brittle BEOL dielectrics of the IC chip.

FIG. 1 illustrates a prior art metal stack crack stop which has been used in copper interconnect technology on IC chips to prevent the propagation of cracks formed during dicing of the IC chip into brittle BEOL dielectrics of the IC chip. The active circuit area 10 of the IC chip is formed generally to the left in FIG. 1, and is bordered by a moisture barrier/edge seal 12 formed along its outer peripheral edge, and a metal stack crack stop 14 formed outside of the edge seal.

The IC chip is formed on a silicon Si substrate, and an exemplary active area of the IC chip is shown on the left side of FIG. 1. The exemplary active area includes an npn nFET transistor device surrounded by shallow trench isolation STI, with a poly conductor above the p gate, a titanium Ti or TiN liner formed around tungsten W above the left n region, and a layer of BPSG (borophospho silicate glass) above the right n region. The active area includes metal layers M1, M2, M3, M4, separated by capping/etch stop layers 16 typically of silicon nitride Si3N4 or silicon carbide SiC, a top surface aluminum layer Al, copper Cu interconnects with refractory metal (such as tantalum Ta) diffusion barriers 18 formed there-around, and BEOL (back end of line) low K dielectric materials 20 such as SiO2.

As illustrated by FIG. 1, in prior art copper Cu interconnect technology, the moisture barrier/edge seal 12 has been formed as a metal stack, with a refractory metal (such as tantalum Ta) diffusion barrier 22 formed there-around, along the outer peripheral edges of the active area of the IC chip. The metal stack is typically formed of a number of via bars 24 formed of copper Cu, the more the better, with a typical number being six. The crack stop 14 has also been formed as a metal stack outside of the moisture barrier/edge seal 12, and typically includes a single via bar 26 formed of copper Cu which is sufficient.

It has been discovered that in a structure such as is shown in FIG. 1, a metal stack does not function as an effective crack stop for Cu interconnect technology embedded in low K dielectrics having a dielectric constant <<4.0. Cracks formed during a dicing operation performed on the IC chip stop at the crack stop 14 in Cu/SiO2 technology, however the exposed Cu in the metal stack is subject to rapid oxidation in the presence of water vapor. The oxidation results in a volume expansion of the Cu and causes separation of layers near the crack stop because of the low elastic modulus of the low K dielectric. This allows moisture to enter the chip, causing failure because of fast water diffusion into the low K dielectrics.

The present invention provides a crack stop for an IC chip using metal interconnects which do not form a self-passivating oxide layer, such as copper or silver interconnects, in a low-K dielectric material, such as SiO2, for preventing damage to the active area of the IC chip caused by chipping and cracking formed along peripheral edges of the IC chip during a dicing operation performed on the IC chip. A moisture barrier/edge seal is formed as a metal stack positioned along the outer peripheral edges of the active area of the IC chip. The crack stop is formed by at least one void trench or groove outside of the moisture barrier/edge seal on the outer periphery of the IC chip.

Figure 2:
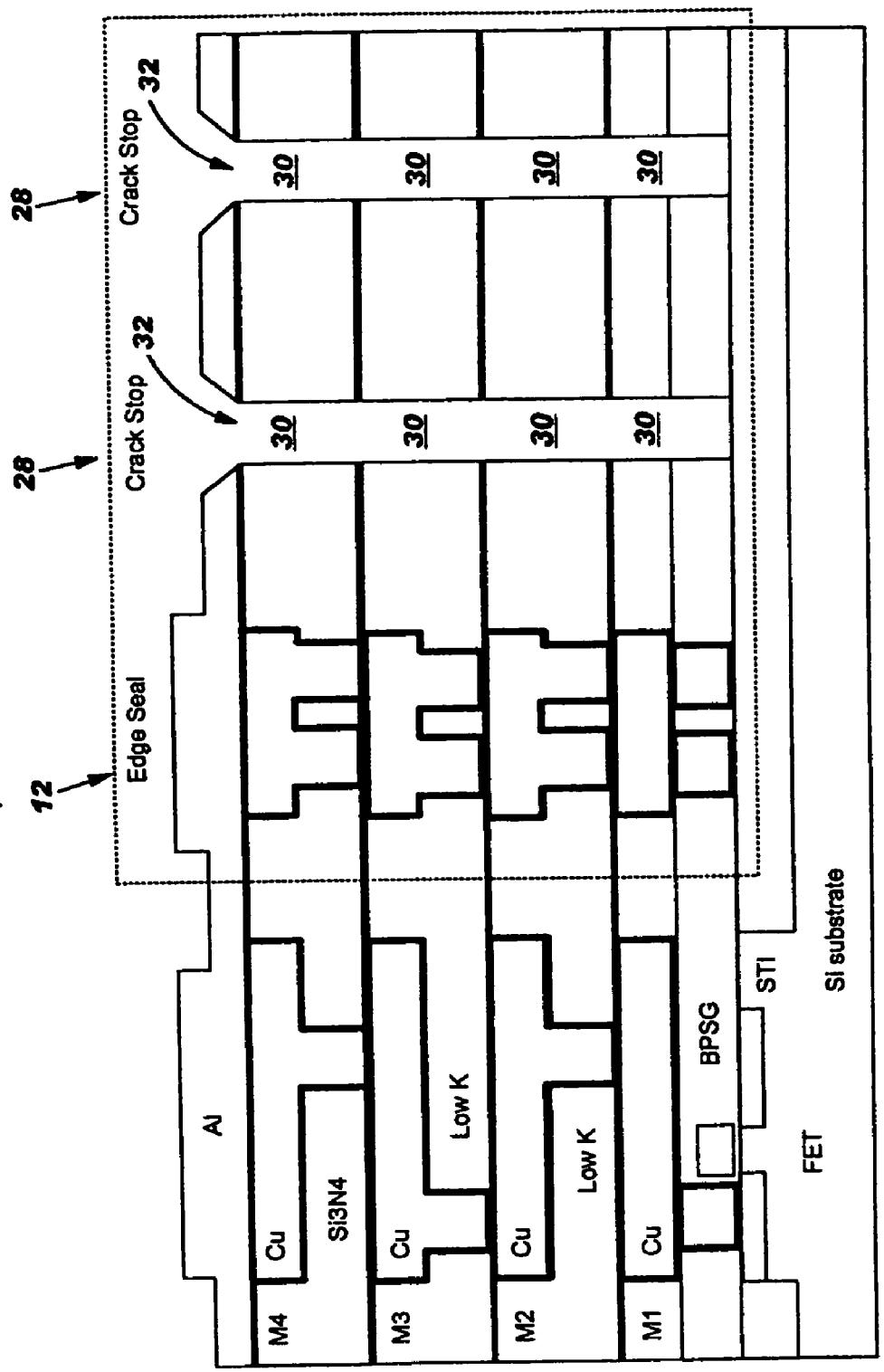
FIG. 2 illustrates an embodiment of the present invention wherein the IC chip incorporates a moisture barrier/edge seal consisting of a metal stack positioned around the outer periphery of the IC chip and a crack stop consisting of at least one outer etched out void ring formed around the moisture barrier.

FIG. 2 illustrates one embodiment of the present invention wherein the chip incorporates a moisture barrier/edge seal and a crack stop.

The active area 10 in FIG. 2 is substantially the same as in FIG. 1, and accordingly the detailed description thereof will not be repeated.

The moisture barrier/edge seal 12 is preferably formed by at least one inner ring or boundary formed around the active circuit area of the IC chip consisting of a metal stack, and can be formed by several inner rings or boundaries, each consisting of a metal stack. Each metal stack can typically be formed of a number of metal lines and via bars formed of copper Cu or silver Ag, the more the better, with a typical number being six.

The crack stop 28 is formed by at least one outer ring or boundary etched out void region 30 formed around the at least one inner ring or boundary of the moisture barrier/edge seal 12, and can be formed by several outer rings, each consisting of an etched out void region 30, with two being shown in FIG. 2. The approach of an etched out void crack stop prevents cracks from ever coming into contact with the moisture barrier/edge seal 12.

The crack stop 28 and moisture barrier/edge seal 12 pursuant to the present invention can be formed as follows. Conventional processing is used to form the IC chip up to the final top Al layer. The crack stop 28 and moisture barrier/edge seal 12 are formed by making a series of stacked metal via structures as illustrated in FIG. 1, such as via bars 24, 26 and the metal lines directly above the via bars, that form a ring around the perimeter of the active circuit area 10 of the IC chip. In different embodiments, any multiple number of rings of moisture barrier/edge seals 12 and any multiple number of rings of crack stops 28 can be formed as desired.

To form the crack stop, the top Al layer is formed on the IC chip, but the Al layer is not formed over/on the regions 32 of the crack stop 28, the terminal via opening. The Al layer is formed on the regions of the edge seal 12, inside the perimeter of the crack stop, to protect the edge seal regions from a subsequent wet etch.

The wafer is then etched in a wet etch that removes the interconnect metal such as Cu or Ag and barrier layers 16 and 18 selective to the Al, such as dilute H2SO4:H2O2 or dilute H2SO4:H2O2:HF. Note that this same wet etch will remove tungsten W and barrier layers contacting silicon Si. In this manner, an etched out void region 30 of a crack stop 28 is formed around the outer peripheral edge of the edge seal 12, which is formed around the active area of the IC chip, to serve as a crack stop for the active area of the IC chip.

While several embodiments and variations of the present invention for a crack stop for low K dielectrics are described in detail herein, it should be apparent that the disclosure and teachings of the present invention will suggest many alternative designs to those skilled in the art.

The invention claimed is:

1. A method for forming a crack stop for an integrated circuit (IC) chip having an active circuit area, wherein the IC chip includes metal interconnects which do not form a self-passivating oxide layer, in a low-K dielectric material, and a moisture barrier/edge seal positioned along the outer peripheral edges of the active area of the IC chip, at least one outer boundary crack stop formed by at least one trench or groove outside of the moisture barrier/edge seal on the outer periphery of the IC chip for preventing damage to the active area of the IC chip caused by chipping and cracking formed along peripheral edges of the IC chip during a dicing operation performed on the wafer, the method comprising:

forming the IC chip on the wafer substantially to completion but without a final top aluminum Al layer, including the steps of
  i) forming an edge seal region including a metal stack moisture barrier around the outer peripheral edges of the active area of the IC chip, and
  ii) forming a stack of metal interconnects and barrier layers outside said moisture barrier and in said edge seal region;

forming a top Al layer over the IC chip, including the step of forming the Al layer on the edge seal region to protect the edge seal region from a subsequent wet etch, without forming the Al layer over said stack of metal interconnects and barrier layers; and after the step of forming said top Al layer, etching the wafer in a wet etch that removes the stack of metal interconnects and baffler layers selective to Al, to form an etched out region as a crack stop.

2. The method of claim 1, including etching the wafer in a wet etch comprising dilute H2SO4:H2O2:HF.

3. The method of claim 1, including etching the wafer in a wet etch comprising dilute H2SO4:H2O2.

4. The method of claim 1, including forming the metal interconnects as copper interconnects.

5. The method of claim 1, including forming the metal interconnects as silver interconnects.

6. The method of claim 1, including forming the moisture barrier/edge seal by forming at least one inner boundary moisture barrier/edge seal by a metal stack around the active circuit area of the IC chip.

7. The method of claim 1, including forming each metal stack by forming a number of metal lines and via bars.

8. The method of claim 1, including forming at least one outer boundary crack stop as an etched out void region formed around the outer peripheral edges of the at least one inner boundary moisture barrier/edge seal.

9. A method according to claim 1, wherein:
the barrier layers include capping/etch stop layers between said metal interconnects, and diffusion barriers extending around said metal interconnect; and
the etching step includes the step of removing said capping/etch stop layers and said diffusion barriers.

* * * * *